US012677460B2

(12) United States Patent
Asaba et al.

(10) Patent No.: US 12,677,460 B2
(45) Date of Patent: Jul. 7, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Shunsuke Asaba, Himeji Hyogo (JP); Hiroshi Kono, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 357 days.

(21) Appl. No.: 18/364,860

(22) Filed: Aug. 3, 2023

(65) Prior Publication Data

US 2024/0321967 A1 Sep. 26, 2024

(30) Foreign Application Priority Data

Mar. 24, 2023 (JP) ................................. 2023-049091

(51) Int. Cl.
*H10D 62/832* (2025.01)
*H10D 30/66* (2025.01)
*H10D 64/23* (2025.01)

(52) U.S. Cl.
CPC ......... *H10D 62/8325* (2025.01); *H10D 30/66* (2025.01); *H10D 64/256* (2025.01)

(58) Field of Classification Search
CPC .. H10D 62/8325; H10D 30/66; H10D 64/256; H10D 12/035; H10D 30/0295;
(Continued)

(56) References Cited

U.S. PATENT DOCUMENTS 9,219,127 B2 * 12/2015 Nakano ................ H10D 64/256
9,882,036 B2 * 1/2018 Kono ..................... H10D 12/01
(Continued)

FOREIGN PATENT DOCUMENTS

JP 2003-031808 A 1/2003
JP 2006-128191 A 5/2006
(Continued)

OTHER PUBLICATIONS

Shunsuke Asaba, et al., "Design guidelines for SBD integration into SiC-MOSFET breaking Ron A—diode conduction capability trade-off," 2022 International Electron Devices Meeting (IEDM), 4 pages.
(Continued)

*Primary Examiner* — Steven B Gauthier
*Assistant Examiner* — Khatib A Rahman
(74) *Attorney, Agent, or Firm* — Kim & Stewart LLP

(57) ABSTRACT

A semiconductor device according to an embodiment includes: a silicon carbide layer having a first face and a second face; first and second gate electrodes; a first silicon carbide region; a second silicon carbide region between the first silicon carbide region and the first face; a third silicon carbide region between the second silicon carbide region and the first face; a fourth silicon carbide region between the third silicon carbide region and the first face; a first electrode; and a second electrode. The first electrode includes a first portion, and the first portion includes a first contact face in contact with the fourth silicon carbide region, a second contact face in contact with the fourth silicon carbide region, a third contact face in contact with the fourth silicon carbide region and the third silicon carbide region, and a fourth contact face in contact with the third silicon carbide region.

13 Claims, 10 Drawing Sheets

(58) Field of Classification Search
CPC .. H10D 30/668; H10D 62/127; H10D 62/393;
H10D 64/2527; H10D 64/62; H10D
84/146
See application file for complete search history.

(56) References Cited

U.S. PATENT DOCUMENTS

| | | | |
|---|---|---|---|
| 2017/0271467 A1 | 9/2017 | Kono | |
| 2021/0288147 A1 * | 9/2021 | Shimizu | H10D 62/8325 |
| 2023/0086599 A1 * | 3/2023 | Asaba | H10D 62/8325 |
| | | | 257/77 |

FOREIGN PATENT DOCUMENTS

| | | | |
|---|---|---|---|
| JP | 2016-103649 A | 6/2016 |
| JP | 2017-168668 A | 9/2017 |
| JP | 2021-145111 A | 9/2021 |
| JP | 2023-045864 A | 4/2023 |

OTHER PUBLICATIONS

Japanese Office Action mailed Jan. 27, 2026 in corresponding
Japanese Patent Application 2023-049091 with English Translation,
12 pages.

* cited by examiner

SEMICONDUCTOR DEVICE

CROSS-REFERENCE TO RELATED APPLICATION

This application is based upon and claims the benefit of priority from Japanese Patent Application No. 2023-049091, filed on Mar. 24, 2023, the entire contents of which are incorporated herein by reference.

FIELD

Embodiments described herein relate generally to a semiconductor device.

BACKGROUND

There is silicon carbide as a material for a semiconductor device. As compared with silicon, silicon carbide has excellent physical properties such as a band gap of about 3 times, a breakdown field strength of about 10 times, and a thermal conductivity of about 3 times. By utilizing these characteristics, for example, a metal oxide semiconductor field effect transistor (MOSFET) capable of operating at a high breakdown voltage, a low loss, and a high temperature can be implemented.

In order to improve the performance of the MOSFET using silicon carbide, it is expected to reduce on-resistance. In order to reduce the on-resistance of the MOSFET, it is conceivable to reduce the parasitic resistance of the MOSFET. The parasitic resistance of the MOSFET is, for example, the electrical resistance of a source region or contact resistance between a source electrode and a source region.

DETAILED DESCRIPTION

Figure 1:
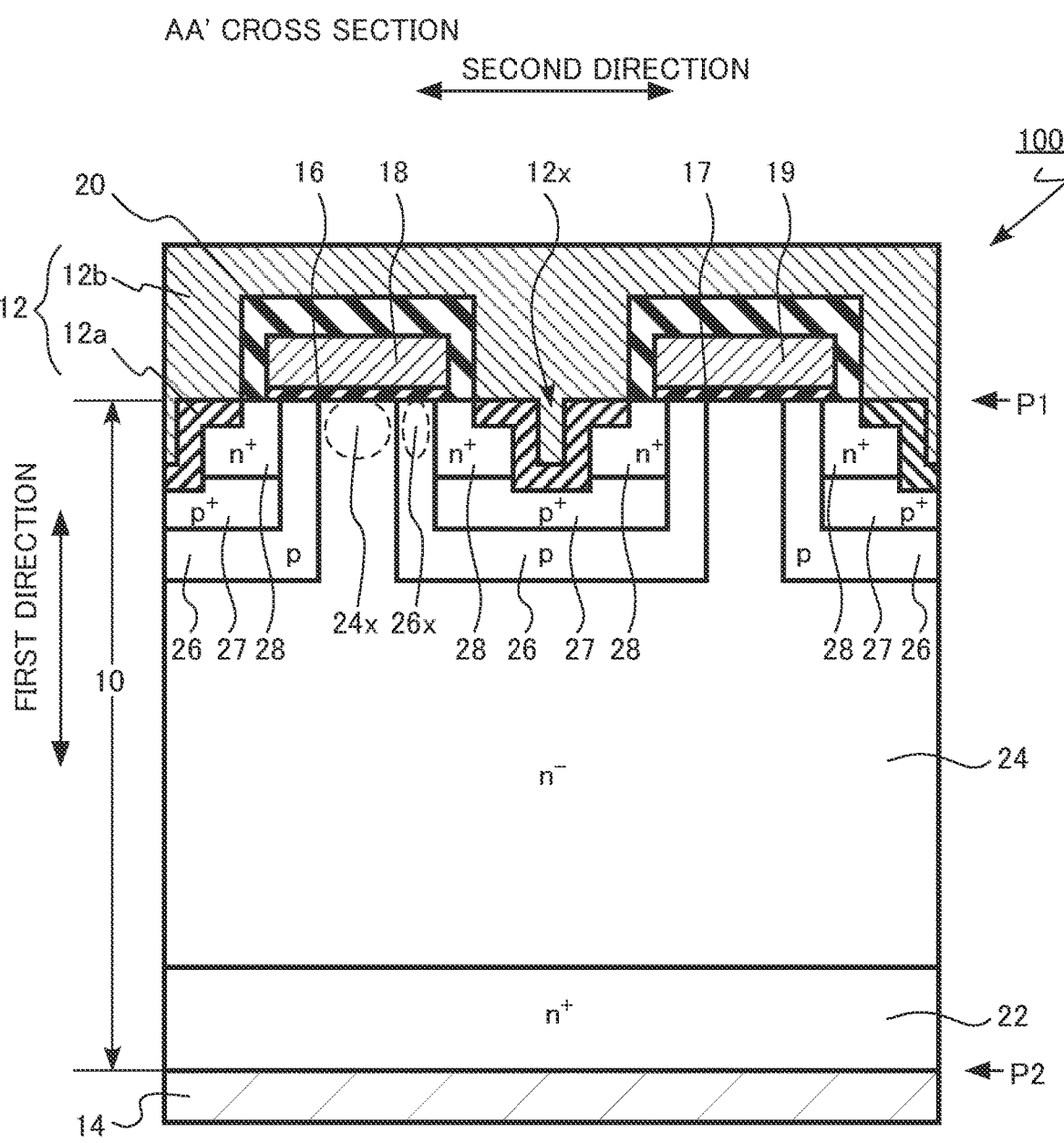
FIG. 1 is a schematic cross-sectional view of a semiconductor device according to a first embodiment.

A semiconductor device according to an embodiment includes: a silicon carbide layer having a first face and a second face facing the first face; a first gate electrode provided on a side of the first face of the silicon carbide layer; a second gate electrode provided on the side of the first face of the silicon carbide layer; a first silicon carbide region of a first conductivity type provided in the silicon carbide layer, the first silicon carbide region having a first region in contact with the first face, the first region facing the first gate electrode; a second silicon carbide region of a second conductivity type provided in the silicon carbide layer and provided between the first silicon carbide region and the first face, the second silicon carbide region having a second region in contact with the first face, the second region facing the first gate electrode; a third silicon carbide region of the second conductivity type provided in the silicon carbide layer and provided between the second silicon carbide region and the first face, the third silicon carbide region having a second conductivity type impurity concentration higher than a second conductivity type impurity concentration of the second silicon carbide region; a fourth silicon carbide region of the first conductivity type provided in the silicon carbide layer and provided between the third silicon carbide region and the first face; a first gate insulating layer provided between the first gate electrode and the second region; a first electrode provided on the side of the first face of the silicon carbide layer; and a second electrode provided on a side of the second face of the silicon carbide layer, in which the first electrode includes a first portion provided between the first gate electrode and the second gate electrode, in which the first portion have a first contact face, a second contact face, a third contact face, and a fourth contact face each in contact with the silicon carbide layer, the first contact face intersects the first face, the second contact face intersects the first contact face, the third contact face intersects the second contact face, and the fourth contact face intersects the third contact face, and in which the first contact face is in contact with the fourth silicon carbide region and faces the second region, the second contact face is in contact with the fourth silicon carbide region and faces the second face, the third contact face is in contact with the fourth silicon carbide region and the third silicon carbide region, and the fourth contact face is in contact with the third silicon carbide region and faces the second face.

Hereinafter, embodiments of the present disclosure will be described with reference to the drawings. In the following description, the same or similar members and the like are denoted by the same reference numerals, and the description of the members and the like once described may be appropriately omitted.

In the following description, notations $n^+$, n, and n and $p^+$, p, and p-represent relative levels of impurity concentration in each conductivity type. That is, $n^+$ indicates that the n-type impurity concentration is relatively higher than n, and n indicates that the n-type impurity concentration is relatively lower than n. In addition, $p^+$ indicates that the p-type impurity concentration is relatively higher than p, and p-indicates that the p-type impurity concentration is relatively lower than p. It is noted that an $n^+$-type and an $n^-$-type may be simply referred to as an n-type, and a $p^+$-type and a $p^-$-type may be simply referred to as a p-type.

Distances such as a thickness, a width, an interval, and a depth of components of the semiconductor device of the embodiment can be obtained from, for example, an image obtained from a scanning electron microscope (SEM) or a transmission electron microscope (TEM).

The impurity concentration of the semiconductor device of the embodiment can be measured by, for example, secondary ion mass spectrometry (SIMS). Further, the relative level of the impurity concentration can also be determined from the level of carrier concentration obtained by, for example, scanning capacitance microscopy (SCM). In addition, distances such as a depth and a thickness of an impurity region can be obtained by, for example, SIMS. Furthermore, distances such as a depth, a thickness, a width, and an interval of the impurity region can be obtained from, for example, a composite image of an SCM image and an atomic force microscope (AFM) image. Furthermore, the distances such as the depth, the thickness, the width, and the interval of the impurity region can be obtained from, for example, an image acquired by SEM.

First Embodiment

A semiconductor device according to a first embodiment includes: a silicon carbide layer having a first face and a second face facing the first face; a first gate electrode provided on a side of the first face of the silicon carbide layer; a second gate electrode provided on the side of the first face of the silicon carbide layer; a first silicon carbide region of a first conductivity type provided in the silicon carbide layer, the first silicon carbide region having a first region in contact with the first face, the first region facing the first gate electrode; a second silicon carbide region of a second conductivity type provided in the silicon carbide layer and provided between the first silicon carbide region and the first face, the second silicon carbide region having a second region in contact with the first face, the second region facing the first gate electrode; a third silicon carbide region of the second conductivity type provided in the silicon carbide layer and provided between the second silicon carbide region and the first face, the third silicon carbide region having a second conductivity type impurity concentration higher than a second conductivity type impurity concentration of the second silicon carbide region; a fourth silicon carbide region of the first conductivity type provided in the silicon carbide layer and provided between the third silicon carbide region and the first face; a first gate insulating layer provided between the first gate electrode and the second region; a first electrode provided on the side of the first face of the silicon carbide layer; and a second electrode provided on a side of the second face of the silicon carbide layer. The first electrode includes a first portion provided between the first gate electrode and the second gate electrode. The first portion have a first contact face, a second contact face, a third contact face, and a fourth contact face each in contact with the silicon carbide layer, the first contact face intersects the first face, the second contact face intersects the first contact face, the third contact face intersects the second contact face, and the fourth contact face intersects the third contact face. The first contact face is in contact with the fourth silicon carbide region and faces the second region, the second contact face is in contact with the fourth silicon carbide region and faces the second face, the third contact face is in contact with the fourth silicon carbide region and the third silicon carbide region, and the fourth contact face is in contact with the third silicon carbide region and faces the second face.

Figure 2:
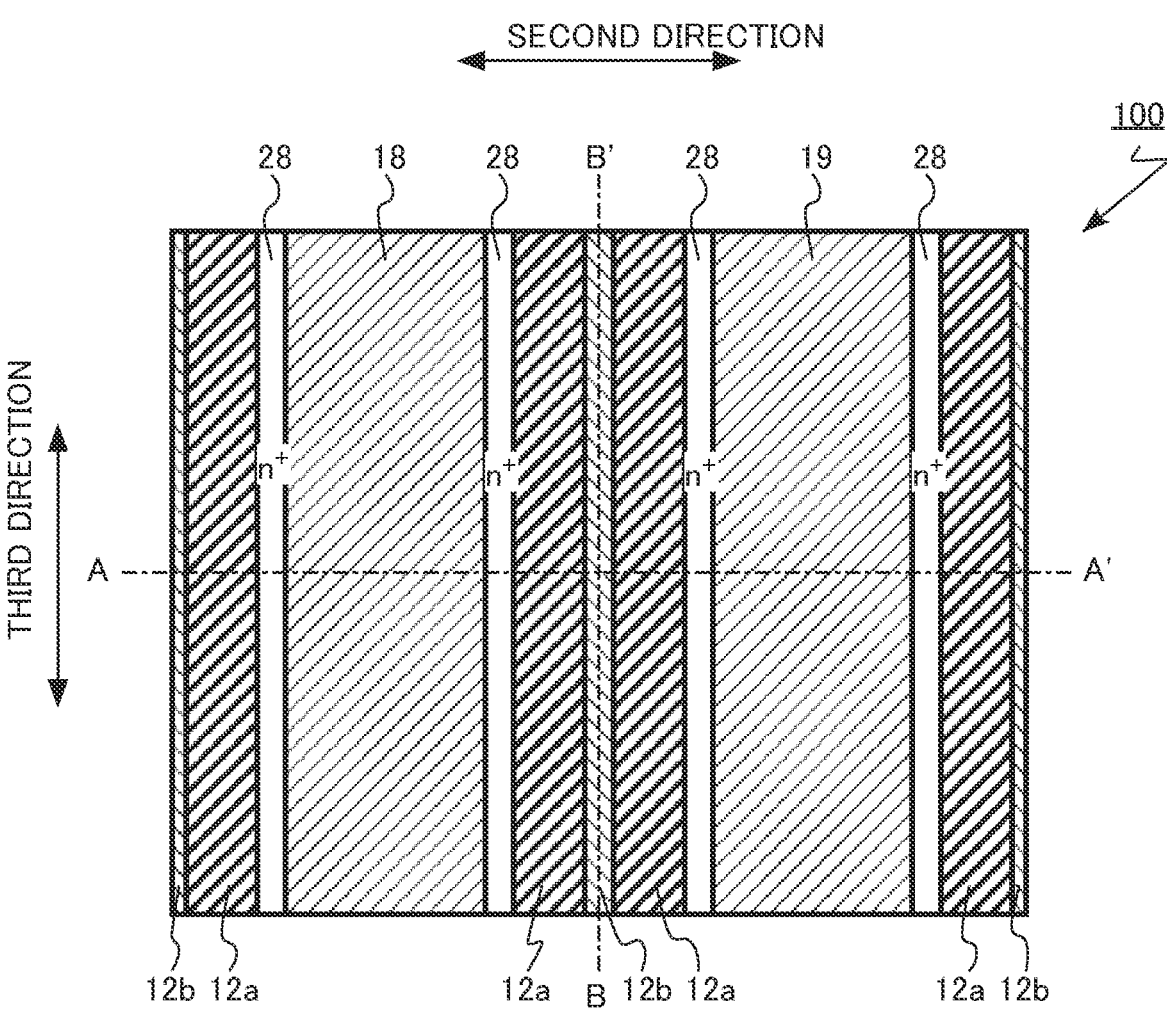
FIG. 2 is a schematic top view of the first embodiment.
Figure 3:
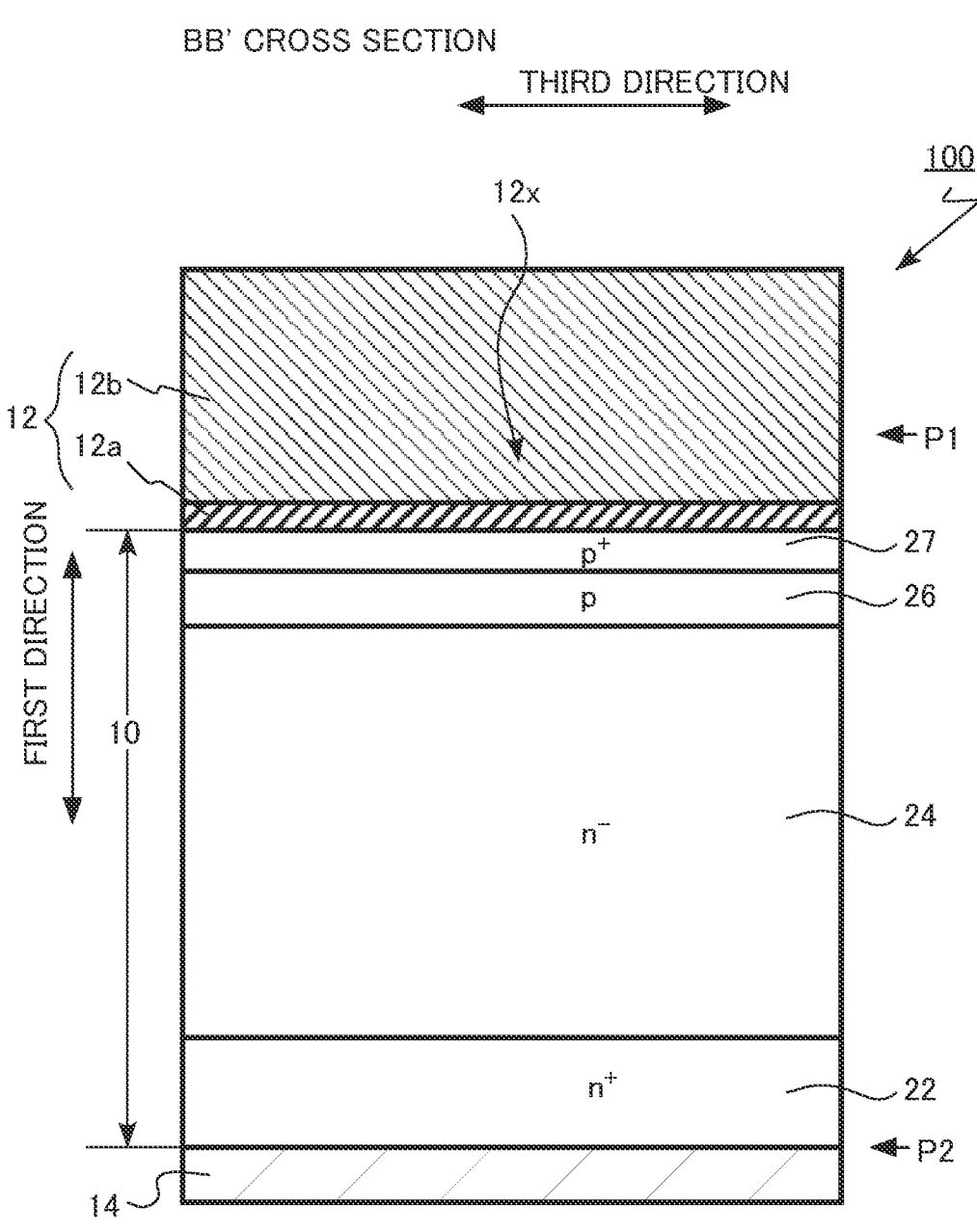
FIG. 3 is a schematic cross-sectional view of the semiconductor device according to the first embodiment.
Figure 4:
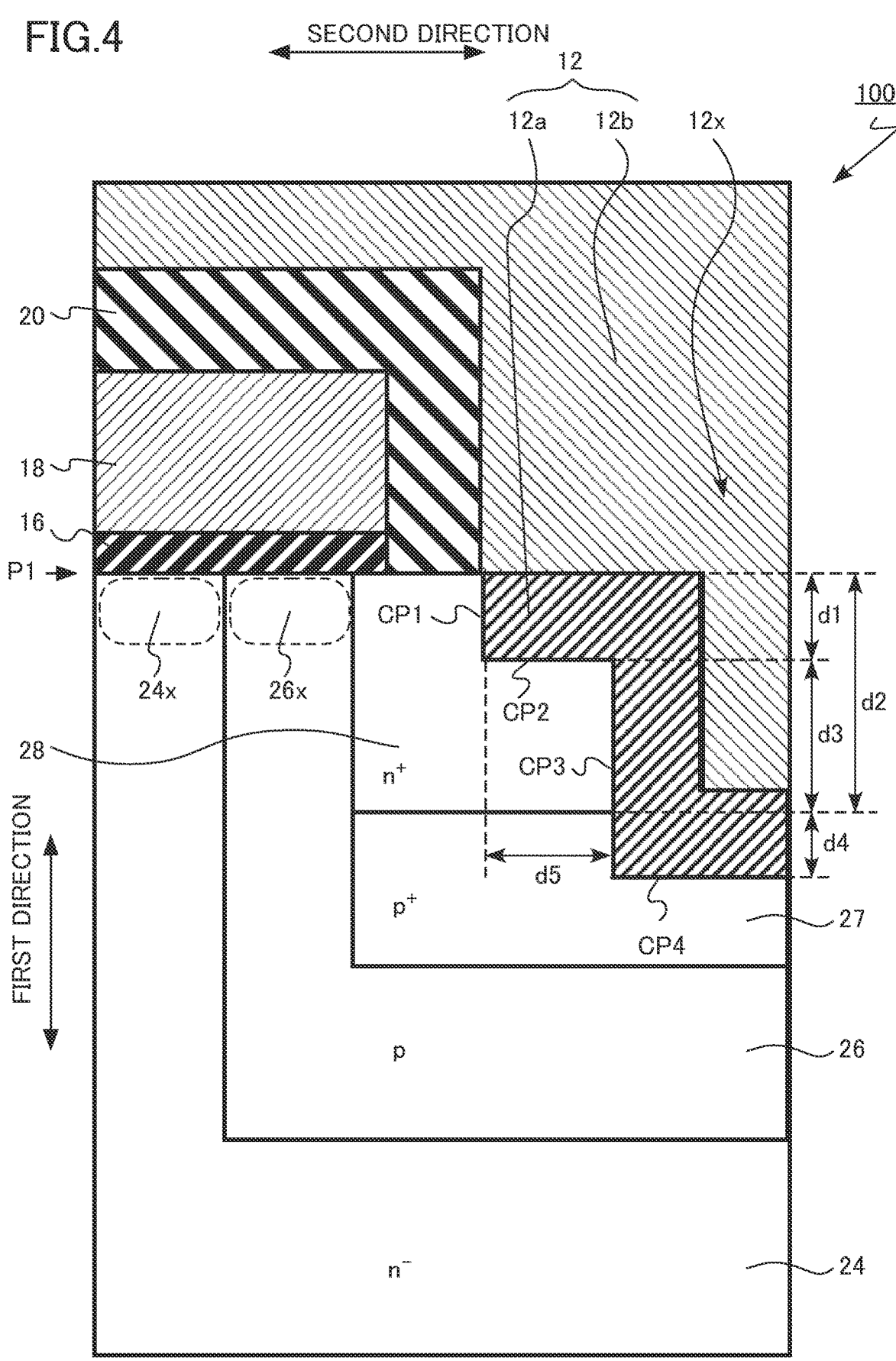
FIG. 4 is an enlarged schematic cross-sectional view of the semiconductor device according to the first embodiment.

FIG. 1 is a schematic cross-sectional view of a semiconductor device according to a first embodiment. FIG. 2 is a schematic top view of the first embodiment. FIG. 2 is a view in which a pattern of a gate electrode is overlapped with a pattern of a silicon carbide region and a source electrode on a silicon carbide layer surface. FIG. 3 is a schematic cross-sectional view of the semiconductor device according to the first embodiment. FIG. 4 is an enlarged schematic cross-sectional view of the semiconductor device according to the first embodiment.

FIG. 1 is a cross section taken along line A-A' in FIG. 2. FIG. 3 is a cross section taken along line B-B' in FIG. 2. FIG. 4 is an enlarged cross-sectional view of a part of FIG. 1.

The semiconductor device according to the first embodiment is a vertical MOSFET 100 of a planar gate type using silicon carbide. The MOSFET 100 according to the first embodiment is, for example, a double implantation MOSFET (DIMOSFET) in which a body region and a source region are formed by ion implantation.

Hereinafter, a description will be given, as an example, as to a case in which a first conductivity type is an n-type and a second conductivity type is a p-type. The MOSFET 100 is a vertical MOSFET of an n-channel type using electrons as carriers.

The MOSFET 100 includes a silicon carbide layer 10, a source electrode 12, a drain electrode 14, a first gate insulating layer 16, a second gate insulating layer 17, a first gate electrode 18, a second gate electrode 19, and an interlayer insulating layer 20. The source electrode 12 is an example of a first electrode. The drain electrode 14 is an example of a second electrode.

The source electrode includes a silicide region 12$a$ and a metal region 12$b$. The source electrode includes a first contact portion 12$x$. The first contact portion 12$x$ is an example of a first portion. The first contact portion 12$x$ includes a first contact face CP1, a second contact face CP2, a third contact face CP3, and a fourth contact face CP4.

In the silicon carbide layer 10, an n$^+$-type drain region 22, an n$^-$-type drift region 24, a p-type body region 26, a p$^+$-type body contact region 27, and an n$^+$-type source region 28 are provided. The drift region 24 is an example of a first silicon carbide region. The body region 26 is an example of a second silicon carbide region. The body contact region 27 is an example of a third silicon carbide region. The source region 28 is an example of a fourth silicon carbide region.

The drift region 24 includes a JFET region 24$x$. The body region 26 includes a channel region 26$x$. The JFET region 24$x$ is an example of a first region. The channel region 26$x$ is an example of a second region.

Hereinafter, a direction from a first face P1 to a second face P2 is defined as a first direction. Further, a direction parallel to the first face P1 is defined as a second direction, and a direction parallel to the first face P1 and orthogonal to the second direction is defined as a third direction.

The silicon carbide layer 10 is provided between the source electrode 12 and the drain electrode 14. The silicon carbide layer 10 is provided between the drain electrode 14 and the first gate electrode 18 and the second gate electrode 19. The silicon carbide layer 10 is single crystal SiC. The silicon carbide layer 10 is, for example, 4H—SiC.

The silicon carbide layer 10 includes the first face ("P1" in FIG. 1) and the second face ("P2" in FIG. 1). Hereinafter, the first face may be referred to as a surface, and the second face may be referred to as a back surface. Hereinafter, the "depth" means a depth based on the first face.

The first face P1 is, for example, a face inclined at 0° or more and 8° or less with respect to a (0001) face. In addition, the second face P2 is, for example, a face inclined at 0° or more and 8° or less with respect to a (000-1) face. The (0001) face is referred to as a silicon face. The (000-1) face is referred to as a carbon face.

The drain region 22 of the n$^+$-type is provided on the back surface side of the silicon carbide layer 10. The drain region 22 contains, for example, nitrogen (N) as an n-type impurity. The n-type impurity concentration of the drain region 22 is, for example, equal to or more than $1\times10^{18}$ cm$^{-3}$ and equal to or less than $1\times10^{21}$ cm$^{-3}$.

The n-type drift region 24 is provided between the drain region 22 and the first face P1. The drift region 24 is provided between the source electrode 12 and the drain electrode 14.

The drift region 24 is provided on the drain region 22. The drift region 24 is, for example, a silicon carbide region formed on the drain region 22 by an epitaxial growth method.

The drift region 24 includes the JFET region 24x in contact with the first face P1. The JFET region 24x is sandwiched between the body regions 26 adjacent to each other in the second direction. The JFET region 24x faces the first gate electrode 18. The JFET region 24x is in contact with the first gate insulating layer 16.

The drift region 24 contains, for example, nitrogen (N) as an n-type impurity. The n-type impurity concentration of the drift region 24 is lower than the n-type impurity concentration of the drain region 22. The n-type impurity concentration of the drift region 24 is, for example, equal to or more than $4 \times 10^{14}$ cm$^{-3}$ and equal to or less than $1 \times 10^{18}$ cm$^{-3}$. The thickness of the drift region 24 is, for example, equal to or more than 5 μm and equal to or less than 150 μm.

The p-type body region 26 is provided between the drift region 24 and the first face P1. The body region 26 extends in the third direction on the first face P1. The plurality of body regions 26 are disposed to be spaced apart from each other in the second direction.

The body region 26 includes the channel region 26x in contact with the first face P1. The channel region 26x is a region in which a channel through which a carrier flows is formed when the MOSFET 100 is turned on.

The channel region 26x is sandwiched between the JFET region 24x and the source region 28 in the second direction. The channel region 26x faces the first gate electrode 18. The channel region 26x is in contact with the first gate insulating layer 16.

The body region 26 contains, for example, aluminum (Al) as a p-type impurity. The p-type impurity concentration of the body region 26 is, for example, equal to or more than $1 \times 10^{17}$ cm$^{-3}$ and equal to or less than $1 \times 10^{18}$ cm$^{-3}$.

The depth of the body region 26 is, for example, equal to or more than 500 nm and equal to or less than 1200 nm.

The body region 26 is fixed to, for example, the electric potential of the source electrode 12.

The p$^+$-type body contact region 27 is provided between the body region 26 and the first face P1. The body contact region 27 extends in the third direction.

The p-type impurity concentration of the body contact region 27 is higher than the p-type impurity concentration of the body region 26.

The body contact region 27 contains, for example, aluminum (Al) as a p-type impurity. The p-type impurity concentration of the body contact region 27 is, for example, equal to or more than $1 \times 10^{19}$ cm$^{-3}$ and equal to or less than $1 \times 10^{21}$ cm$^{-3}$.

The depth of the body contact region 27 is, for example, equal to or more than 300 nm and equal to or less than 600 nm.

The body contact region 27 is in contact with the source electrode 12. A junction between the body contact region 27 and the source electrode 12 is, for example, an ohmic junction.

The n$^+$-type source region 28 is provided between the body region 26 and the first face P1. The source region 28 is provided between the body contact region 27 and the first face P1. The source region 28 extends in the third direction on the first face P1.

The source region 28 contains, for example, phosphorus (P) as an n-type impurity. The n-type impurity concentration of the source region 28 is higher than the n-type impurity concentration of the drift region 24.

The n-type impurity concentration of the source region 28 is, for example, equal to or more than $1 \times 10^{19}$ cm$^{-3}$ and equal to or less than $1 \times 10^{21}$ cm$^{-3}$. The depth of the source region 28 is shallower than the depth of the body region 26 and the depth of the body contact region 27. The depth of the source region 28 is equal to or more than 150 nm and equal to or less than 300 nm.

The source region 28 is in contact with the source electrode 12. A junction between the source region 28 and the source electrode 12 is, for example, an ohmic junction.

The source region 28 is fixed to the electric potential of the source electrode 12.

The first gate electrode 18 is provided on the first face P1 side of the silicon carbide layer 10. As illustrated in FIG. 2, the first gate electrode 18 extends in the third direction parallel to the first face P1.

The second gate electrode 19 is provided on the first face P1 side of the silicon carbide layer 10. As illustrated in FIG. 2, the second gate electrode 19 extends in the third direction parallel to the first face P1. The second gate electrode 19 is provided in the second direction with respect to the first gate electrode 18.

The first gate electrode 18 and the second gate electrode 19 are conductive layers. The first gate electrode 18 and the second gate electrode 19 are, for example, polycrystalline silicon containing a p-type impurity or an n-type impurity.

The first gate insulating layer 16 is provided between the first gate electrode 18 and the drift region 24 and the body region 26. The first gate insulating layer 16 is provided between the first gate electrode 18 and the JFET region 24x and the channel region 26x.

The second gate insulating layer 17 is provided between the second gate electrode 19 and the drift region 24 and the body region 26.

The first gate insulating layer 16 and the second gate insulating layer 17 are, for example, silicon oxide. For example, a high-k insulating material (high dielectric constant insulating material) can be applied to the first gate insulating layer 16 and the second gate insulating layer 17.

The interlayer insulating layer 20 is provided on the first gate electrode 18, the second gate electrode 19, and the silicon carbide layer 10. The interlayer insulating layer 20 is, for example, silicon oxide.

The source electrode 12 is provided on the first face P1 side of the silicon carbide layer 10. The source electrode 12 is in contact with the source region 28. The source electrode 12 is in contact with the body contact region 27.

The source electrode 12 includes the silicide region 12a and the metal region 12b. The silicide region 12a is provided between the metal region 12b and the silicon carbide layer 10.

The silicide region 12a is in contact with the silicon carbide layer 10. The silicide region 12a is in contact with the source region 28. The silicide region 12a is in contact with the body contact region 27.

The source electrode 12 contains metal. The silicide region 12a is, for example, nickel silicide or titanium silicide. The metal region 12b has, for example, a stacked structure of titanium (Ti) and aluminum (Al).

The source electrode 12 includes the first contact portion 12x. The first contact portion 12x is provided between the first gate electrode 18 and the second gate electrode 19. The first contact portion 12x is provided, for example, in a trench formed in the silicon carbide layer 10. As illustrated in FIG. 3, the first contact portion 12x extends, for example, in the third direction.

As illustrated in FIG. 4, the first contact portion 12x has the first contact face CP1 in contact with the silicon carbide layer 10, the second contact face CP2 in contact with the silicon carbide layer 10, the third contact face CP3 in contact with the silicon carbide layer 10, and the fourth contact face CP4 in contact with the silicon carbide layer 10. The first contact face CP1, the second contact face CP2, the third contact face CP3, and the fourth contact face CP4 are a part of the first contact portion 12x. The silicide region 12a of the first contact portion 12x has the first contact face CP1, the second contact face CP2, the third contact face CP3, and the fourth contact face CP4.

The first contact face CP1 intersects the first face P1. An angle formed by the first contact face CP1 and the first face P1 is, for example, equal to or more than 45 degrees and equal to or less than 90 degrees.

The first contact face CP1 is in contact with the source region 28. The first contact face CP1 faces the channel region 26x. In the second direction, the channel region 26x is provided between the JFET region 24x and the first contact face CP1.

The second contact face CP2 intersects the first contact face CP1. The second contact face CP2 is continuous with the first contact face CP1. An angle formed by the second contact face CP2 and the first face P1 is, for example, equal to or more than 0 degree and equal to or less than 30 degrees.

The second contact face CP2 is in contact with the source region 28. The second contact face CP2 faces the second face P2. The second contact face CP2 faces the body contact region 27. The source region 28 is provided between the second contact face CP2 and the body contact region 27.

The third contact face CP3 intersects the second contact face CP2. The third contact face CP3 is continuous with the second contact face CP2. An angle formed by the third contact face CP3 and the second contact face CP2 is, for example, equal to or more than 45 degrees and equal to or less than 90 degrees. An angle formed by the third contact face CP3 and the first face P1 is, for example, equal to or more than 45 degrees and equal to or less than 90 degrees.

The third contact face CP3 is in contact with the source region 28 and the body contact region 27. The source region 28 is provided between the third contact face CP3 and the body region 26. The body contact region 27 is provided between the third contact face CP3 and the body region 26.

The fourth contact face CP4 intersects the third contact face CP3. The fourth contact face CP4 is continuous with the third contact face CP3. An angle formed by the fourth contact face CP4 and the first face P1 is, for example, equal to or more than 0 degree and equal to or less than 30 degrees.

The fourth contact face CP4 is in contact with the body contact region 27. The fourth contact face CP4 faces the second face P2. The body contact region 27 is provided between the fourth contact face CP4 and the body region 26.

A distance (d1 in FIG. 4) from the first face P1 to the second contact face CP2 in the first direction is, for example, equal to or more than ⅓ and equal to or less than ¾ of a depth (d2 in FIG. 4) of the source region 28 in the first direction with reference to the first face P1.

The distance (d1 in FIG. 4) from the first face P1 to the second contact face CP2 in the first direction is, for example, equal to or more than 50 nm and equal to or less than 150 nm. A distance from the first face P1 to the fourth contact face CP4 in the first direction from the first face P1 to the second face P2 is equal to or more than 150 nm and equal to or less than 600 nm.

For example, a length (d3 in FIG. 4) of a portion at which the third contact face CP3 is in contact with the source region 28 in the first direction is longer than a length (d4 in FIG. 4) of a portion at which the third contact face CP3 is in contact with the body contact region 27 in the first direction.

A length (d5 in FIG. 4) of the second contact face CP2 in the second direction is longer than, for example, the distance (d1 in FIG. 4) from the first face P1 to the second contact face CP2 in the first direction.

The drain electrode 14 is provided on the second face P2 side of the silicon carbide layer 10. The drain electrode 14 is provided on the back surface of the silicon carbide layer 10. The drain electrode 14 is in contact with the drain region 22.

The drain electrode 14 is, for example, a metal or a metal semiconductor compound. The drain electrode 14 contains, for example, at least one material selected from a group consisting of nickel silicide, titanium (Ti), nickel (Ni), silver (Ag), and gold (Au).

Next, functions and effects of the semiconductor device according to the first embodiment will be described.

In order to improve the performance of the MOSFET using silicon carbide, it is expected to reduce on-resistance. In order to reduce the on-resistance of the MOSFET, it is conceivable to reduce the parasitic resistance of the MOSFET. The parasitic resistance of the MOSFET is, for example, an electric resistance of the source region or a contact resistance between the source electrode and the source region.

Figure 5:
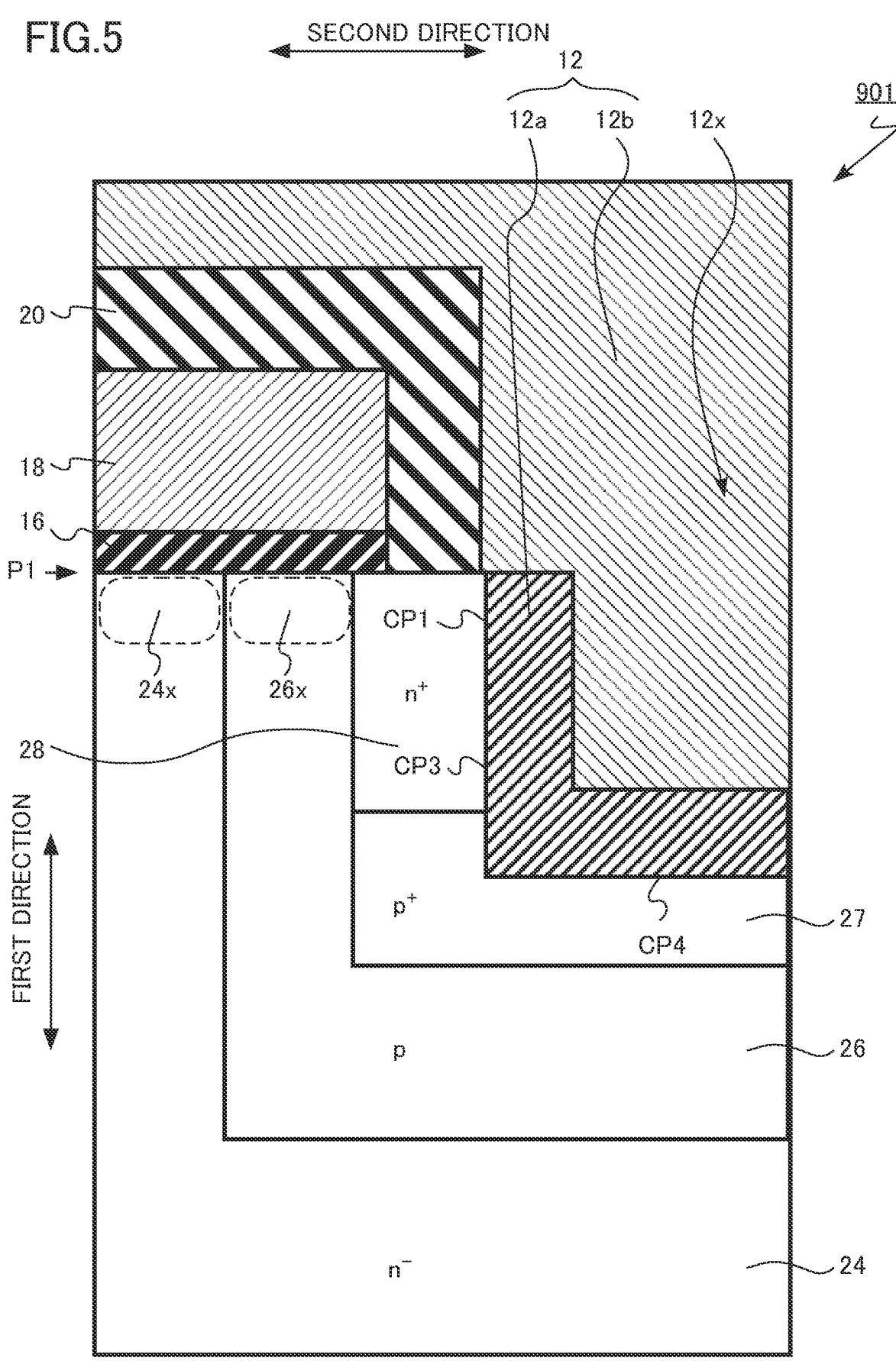
FIG. 5 is an enlarged schematic cross-sectional view of a semiconductor device according to a first comparative example.

FIG. 5 is an enlarged schematic cross-sectional view of a semiconductor device according to a first comparative example. FIG. 5 is a diagram corresponding to FIG. 4 of the first embodiment.

The semiconductor device according to the first comparative example is a MOSFET 901. The MOSFET 901 is different from the MOSFET 100 according to the first embodiment in that the first contact portion 12x does not include the second contact face CP2.

The first contact portion 12x is in contact with both the source region 28 and the body contact region 27. Of the contact resistance between the first contact portion 12x and the source region 28 and the contact resistance between the first contact portion 12x and the body contact region 27, the parasitic resistance of the MOSFET 901 is the former contact resistance between the first contact portion 12x and the source region 28. Therefore, in order to reduce the parasitic resistance of the MOSFET 901, it is preferable to increase a contact area between the first contact portion 12x and the source region 28.

In the MOSFET 901, in the cross section illustrated in FIG. 5, only a part of the first contact face CP1 and the third contact face CP3 contributes to the contact area between the first contact portion 12x and the source region 28. In this case, the contact resistance between the first contact portion 12x and the source region 28 is large, and the parasitic resistance of the MOSFET 901 may not sufficiently decrease.

Figure 6:
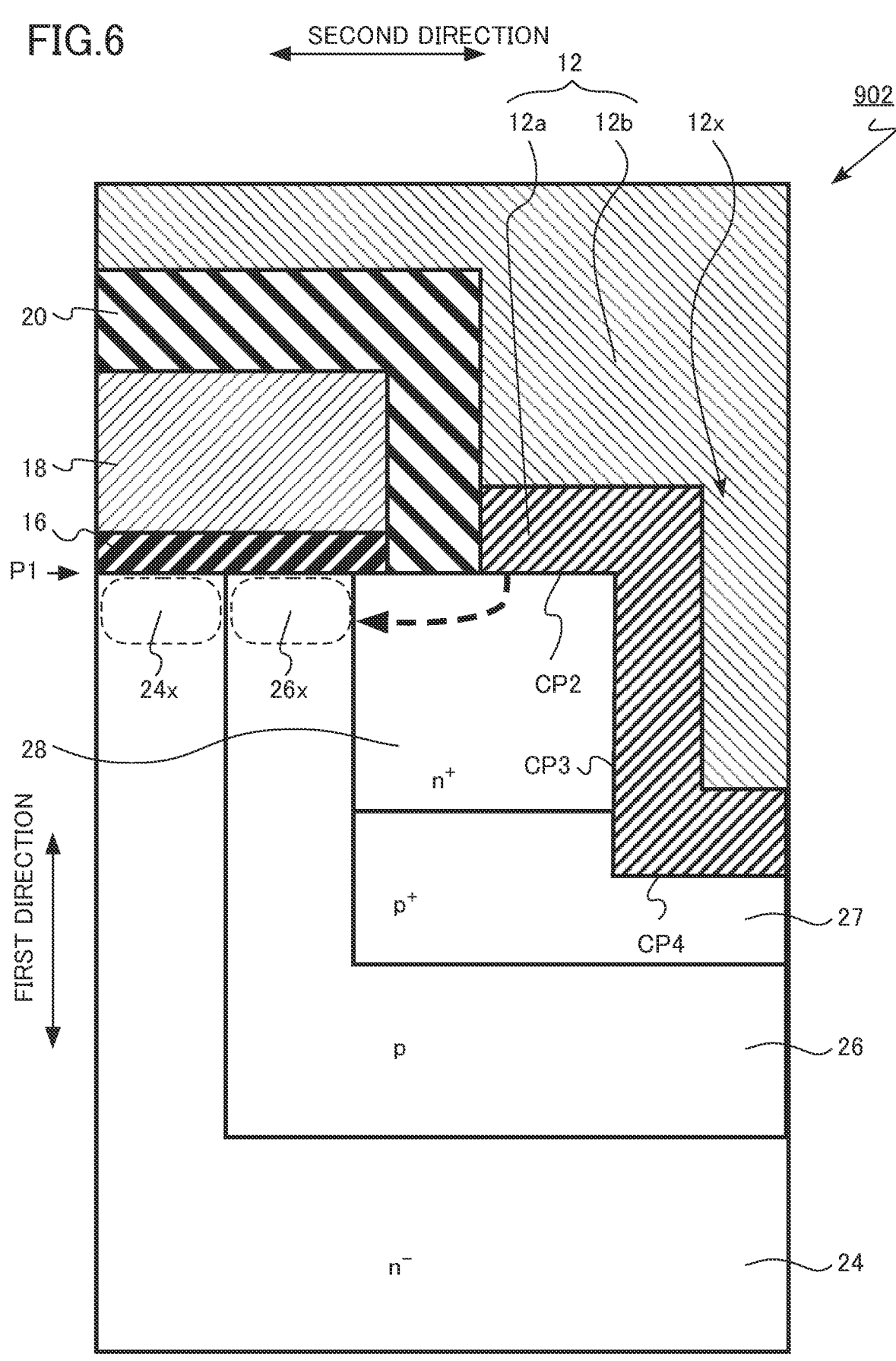
FIG. 6 is an enlarged schematic cross-sectional view of a semiconductor device according to a second comparative example.

FIG. 6 is an enlarged schematic cross-sectional view of a semiconductor device according to a second comparative example. FIG. 6 is a diagram corresponding to FIG. 4 of the first embodiment.

The semiconductor device according to the second comparative example is a MOSFET 902. The MOSFET 902 is different from the MOSFET 100 according to the first embodiment in that the first contact portion 12x does not include the first contact face CP1.

When a distance of the source region 28 existing between the first contact portion 12x and the channel region 26x increases, the electric resistance of the source region 28 increases, and as such the parasitic resistance of the MOSFET 902 increases.

In the MOSFET 902, a carrier flows in a path indicated by a dotted arrow in FIG. 6. If this path becomes long, the effective electric resistance of the source region 28 increases, and the parasitic resistance of the MOSFET 902 may not sufficiently decrease.

The first contact portion 12x of the MOSFET 100 according to the first embodiment has the first contact face CP1 and the second contact face CP2. Since the MOSFET 100 according to the first embodiment has the second contact face CP2, the contact area between the first contact portion 12x and the source region 28 can be increased as compared with the MOSFET 901 of the first comparative example. Therefore, the parasitic resistance of the MOSFET 100 can be reduced.

In addition, since the MOSFET 100 according to the first embodiment has the first contact face CP1, the distance of the source region 28 existing between the first contact portion 12x and the channel region 26x can be reduced as compared with the MOSFET 902 of the second comparative example. Therefore, the effective electric resistance of the source region 28 of the MOSFET 100 can be reduced. Therefore, the parasitic resistance of the MOSFET 100 can be reduced.

As described above, with the MOSFET 100 of the first embodiment, the on-resistance can be reduced by reducing the parasitic resistance.

The distance (d1 in FIG. 4) from the first face P1 to the second contact face CP2 in the first direction is preferably equal to or more than ⅓, and more preferably equal to or more than ½ of the depth (d2 in FIG. 4) of the source region 28 in the first direction with respect to the first face P1. By exceeding the above lower limit value, a portion having a short distance to the channel region 26x increases in the first contact portion 12x. Therefore, the effective electric resistance of the source region 28 of the MOSFET 100 can be further reduced. Therefore, the parasitic resistance of the MOSFET 100 can be further reduced.

The distance (d1 in FIG. 4) from the first face P1 to the second contact face CP2 in the first direction is preferably equal to or more than 50 nm, more preferably equal to or more than 80 nm, and still more preferably equal to or more than 100 nm. By exceeding the above lower limit value, a portion having a short distance to the channel region 26x increases in the first contact portion 12x. Therefore, the effective electric resistance of the source region 28 of the MOSFET 100 can be further reduced. Therefore, the parasitic resistance of the MOSFET 100 can be further reduced.

For example, the length (d3 in FIG. 4) of the portion at which the third contact face CP3 is in contact with the source region 28 in the first direction is longer than the length (d4 in FIG. 4) of the portion at which the third contact face CP3 is in contact with the body contact region 27 in the first direction. As the length d3 of the portion at which the third contact face CP3 is in contact with the source region 28 increases, the contact area between the first contact portion 12x and the source region 28 further increases. Therefore, the contact resistance between the first contact portion 12x and the source region 28 is further reduced. Accordingly, the parasitic resistance of the MOSFET 100 is further reduced.

The length (d5 in FIG. 4) of the second contact face CP2 in the second direction is preferably longer than the distance (d1 in FIG. 4) from the first face P1 to the second contact face CP2 in the first direction. As the length d5 of the second contact face CP2 increases, the contact area between the first contact portion 12x and the source region 28 further increases, and the contact resistance between the first contact portion 12x and the source region 28 is further reduced. Therefore, the parasitic resistance of the MOSFET 100 is further reduced.

As described above, according to the first embodiment, it is possible to provide a semiconductor device capable of reducing on-resistance by reducing parasitic resistance.

Second Embodiment

In a semiconductor device according to a second embodiment, a first electrode is provided between a first gate electrode and a second gate electrode, and the semiconductor device further includes a second portion located in a third direction of a first portion. A fourth silicon carbide region is provided between the first portion and the second portion. The first portion further includes a fifth contact face in contact with a silicon carbide layer and intersecting a fourth contact face, and the second portion includes a sixth contact face in contact with the silicon carbide layer and a seventh contact face in contact with the silicon carbide layer, the seventh contact face intersecting the sixth contact face. The semiconductor device according to the second embodiment is different from the semiconductor device according to the first embodiment in that the fifth contact face is in contact with the fourth silicon carbide region and a third silicon carbide region, the sixth contact face is in contact with the fourth silicon carbide region and the third silicon carbide region and faces the fifth contact face, and the seventh contact face is in contact with the third silicon carbide region and faces a second face. Hereinafter, some descriptions of contents overlapping with the first embodiment may be omitted.

Figure 7:
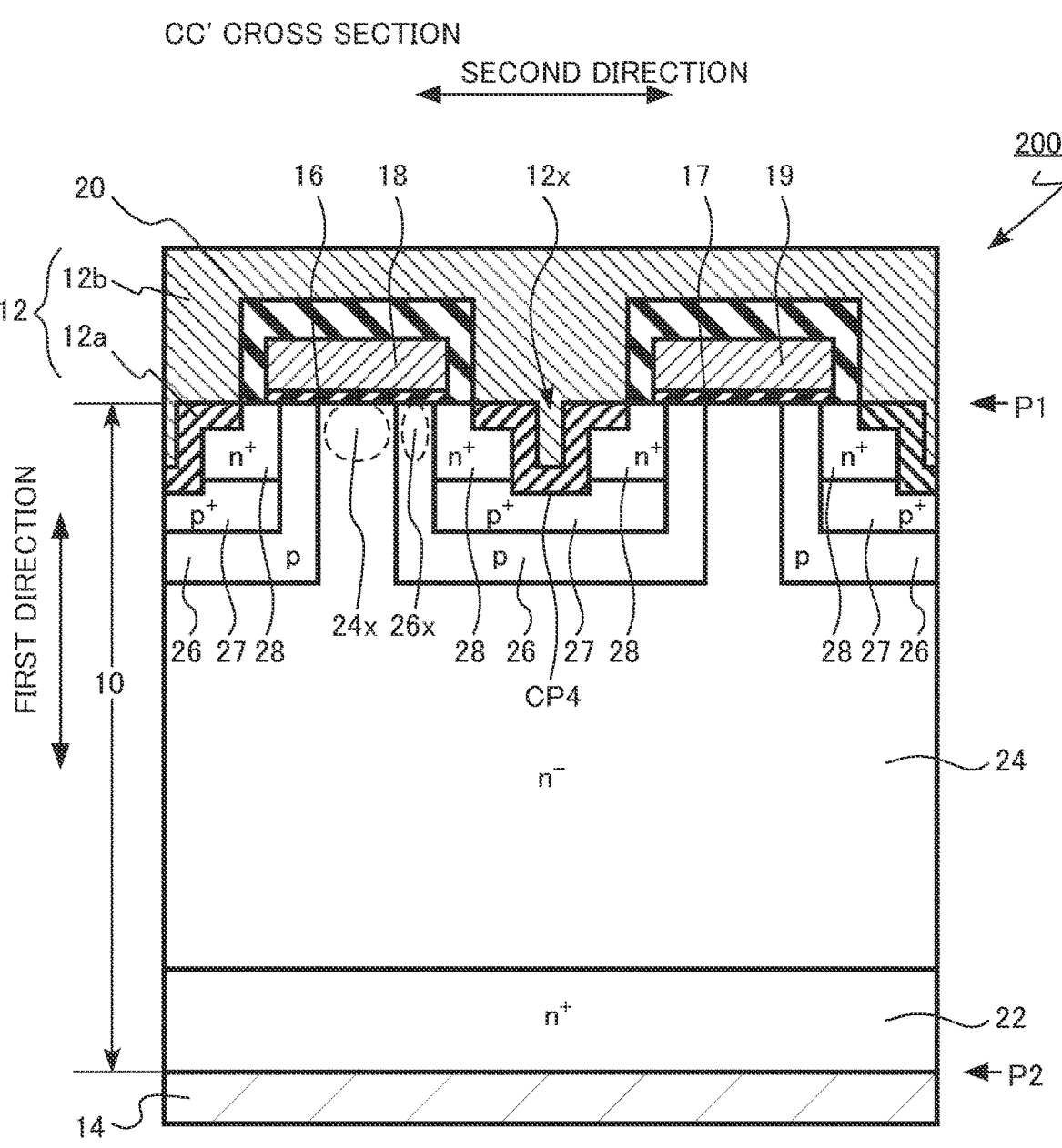
FIG. 7 is a schematic cross-sectional view of a semiconductor device according to a second embodiment.
Figure 8:
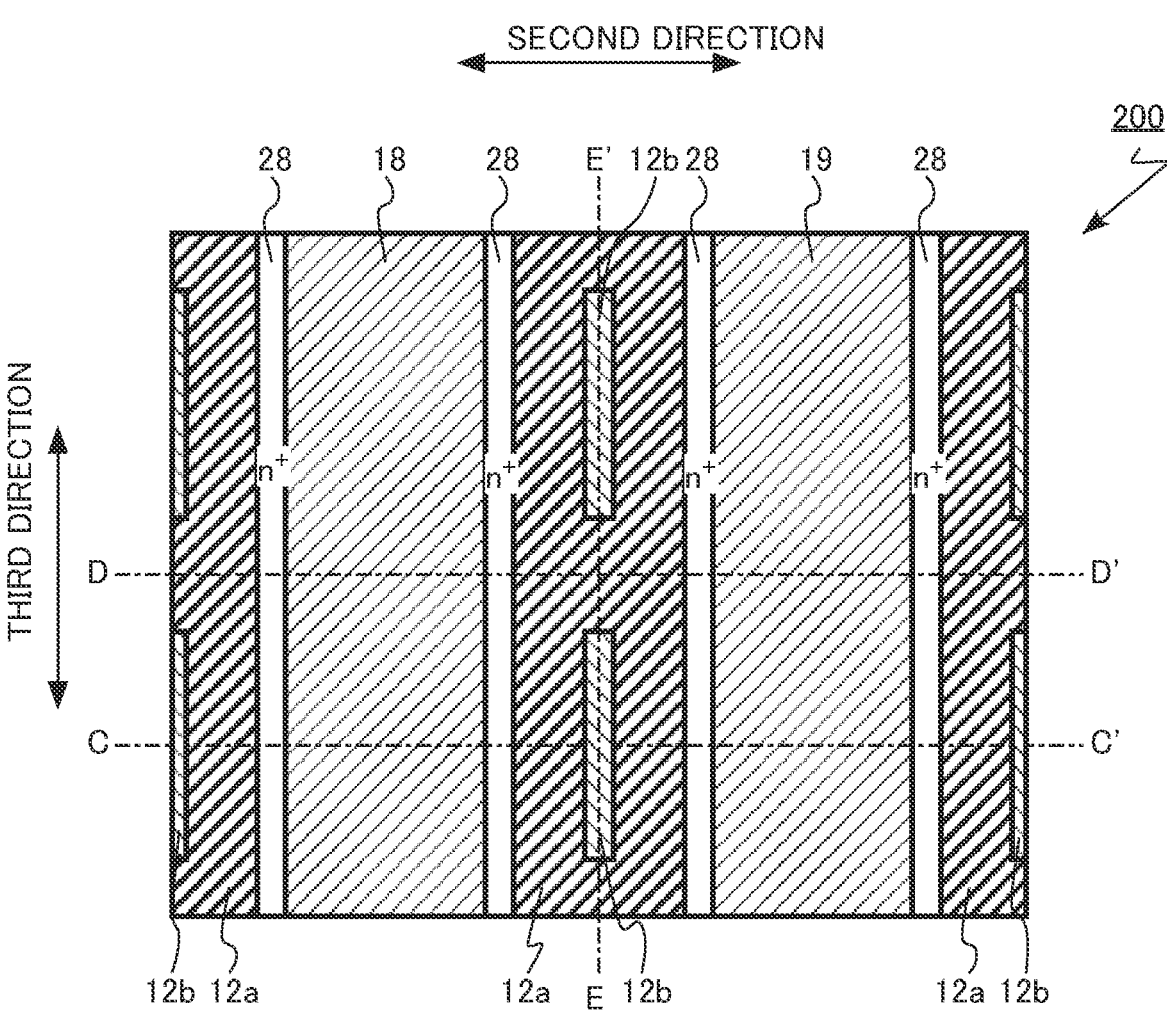
FIG. 8 is a schematic top view of the second embodiment.
Figure 9:
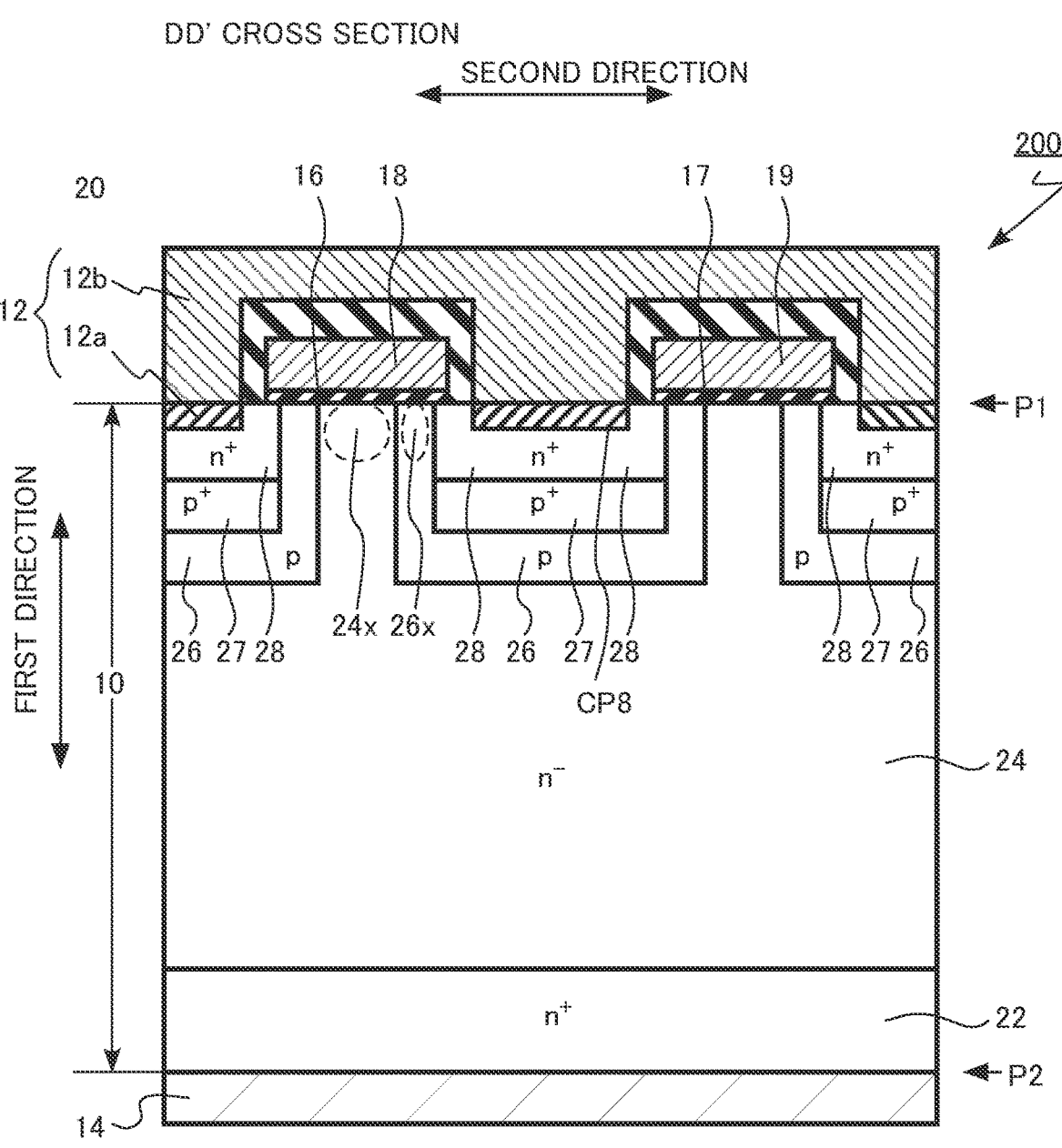
FIG. 9 is a schematic cross-sectional view of the semiconductor device according to the second embodiment.
Figure 10:
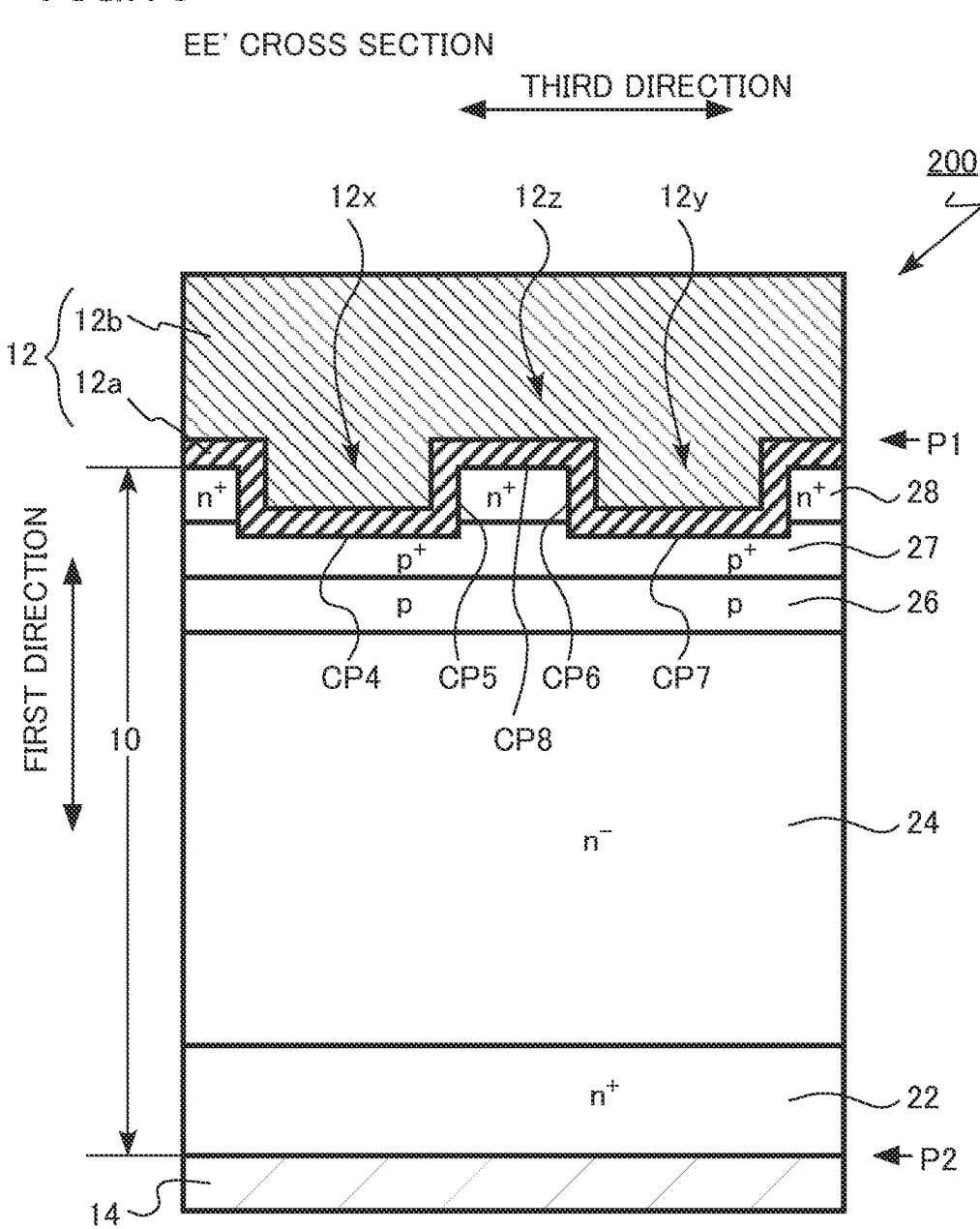
FIG. 10 is a schematic cross-sectional view of the semiconductor device according to the second embodiment.

FIG. 7 is a schematic cross-sectional view of the semiconductor device according to the second embodiment. FIG. 8 is a schematic top view of the second embodiment. FIG. 8 is a view in which a pattern of a gate electrode is overlapped with a pattern of a silicon carbide region and a source electrode on a silicon carbide layer surface. FIGS. 9 and 10 are schematic cross-sectional views of the semiconductor device according to the second embodiment.

FIG. 7 is a cross section taken along line C-C' in FIG. 8. FIG. 9 is a cross section taken along line D-D' in FIG. 8. FIG. 10 is a cross section taken along line E-E' in FIG. 8.

The semiconductor device according to the second embodiment is a planar gate type vertical MOSFET 200 using silicon carbide. The MOSFET 200 of the second embodiment is, for example, a DIMOSFET in which a body region and a source region are formed by ion implantation.

The MOSFET 200 includes a silicon carbide layer 10, a source electrode 12, a drain electrode 14, a first gate insulating layer 16, a second gate insulating layer 17, a first gate electrode 18, a second gate electrode 19, and an interlayer insulating layer 20. The source electrode 12 is an example of a first electrode. The drain electrode 14 is an example of a second electrode.

The source electrode includes a silicide region 12a and a metal region 12b.

The source electrode includes a first contact portion 12x. The first contact portion 12x is an example of a first portion. The first contact portion 12x includes a first contact face CP1, a second contact face CP2, a third contact face CP3, a fourth contact face CP4, and a fifth contact face CP5.

The source electrode includes a second contact portion 12$y$. The second contact portion 12$y$ is an example of a second portion. The second contact portion 12$y$ includes a sixth contact face CP6 and a seventh contact face CP7.

The source electrode includes a third contact portion 12$z$. The third contact portion 12$z$ is an example of a third portion. The third contact portion 12$z$ includes an eighth contact face CP8.

In the silicon carbide layer 10, an n$^+$-type drain region 22, an n-type drift region 24, a p-type body region 26, a p$^+$-type body contact region 27, and an n$^+$-type source region 28 are provided. The drift region 24 is an example of a first silicon carbide region. The body region 26 is an example of a second silicon carbide region. The body contact region 27 is an example of a third silicon carbide region. The source region 28 is an example of a fourth silicon carbide region.

The drift region 24 includes a JFET region 24$x$. The body region 26 includes a channel region 26$x$. The JFET region 24$x$ is an example of a first region. The channel region 26$x$ is an example of a second region.

The source electrode 12 includes the first contact portion 12$x$, the second contact portion 12$y$, and the third contact portion 12$z$. The first contact portion 12$x$, the second contact portion 12$y$, and the third contact portion 12$z$ are provided between the first gate electrode 18 and the second gate electrode 19.

As illustrated in FIG. 10, the second contact portion 12$y$ is located in the third direction with respect to the first contact portion 12$x$. The first contact portion 12$x$ and the second contact portion 12$y$ are provided, for example, respectively in two trenches formed separately in the third direction in the silicon carbide layer 10. The source region 28 and the body contact region 27 are provided between the first contact portion 12$x$ and the second contact portion 12$y$.

As illustrated in FIG. 10, the third contact portion 12$z$ is located between the first contact portion 12$x$ and the second contact portion 12$y$.

The first contact portion 12$x$ has the first contact face CP1 in contact with the silicon carbide layer 10, the second contact face CP2 in contact with the silicon carbide layer 10, the third contact face CP3 in contact with the silicon carbide layer 10, the fourth contact face CP4 in contact with the silicon carbide layer 10, and the fifth contact face CP5 in contact with the silicon carbide layer 10. The first contact face CP1, the second contact face CP2, the third contact face CP3, the fourth contact face CP4, and the fifth contact face CP5 are a part of the first contact portion 12$x$. The silicide region 12$a$ of the first contact portion 12$x$ has the first contact face CP1, the second contact face CP2, the third contact face CP3, the fourth contact face CP4, and the fifth contact face CP5.

The second contact portion 12$y$ has the sixth contact face CP6 in contact with the silicon carbide layer 10 and the seventh contact face CP7 in contact with the silicon carbide layer 10. The silicide region 12$a$ of the second contact portion 12$y$ has the seventh contact face CP7.

The third contact portion 12$z$ has the eighth contact face CP8 in contact with the silicon carbide layer 10. The silicide region 12$a$ of the third contact portion 12$z$ has the eighth contact face CP8.

The fifth contact face CP5 intersects the fourth contact face CP4. An angle formed by the fifth contact face CP5 and the fourth contact face CP4 is, for example, equal to or more than 45 degrees and equal to or less than 90 degrees. The fifth contact face CP5 is in contact with the source region 28 and the body contact region 27.

The sixth contact face CP6 is in contact with the source region 28 and the body contact region 27. The sixth contact face CP6 faces the fifth contact face CP5 in the third direction. The source region 28 and the body contact region 27 are provided between the fifth contact face CP5 and the sixth contact face CP6.

The seventh contact face CP7 intersects the sixth contact face CP6. An angle formed by the seventh contact face CP7 and the sixth contact face CP6 is, for example, equal to or more than 45 degrees and equal to or less than 90 degrees. The seventh contact face CP7 is continuous with the sixth contact face CP6.

The seventh contact face CP7 is in contact with the body contact region 27. The seventh contact face CP7 faces the second face P2. The body contact region 27 is provided between the seventh contact face CP7 and the body region 26.

The eighth contact face CP8 is in contact with the source region 28. The eighth contact face CP8 faces the second face P2. The eighth contact face CP8 intersects the fifth contact face CP5 and the sixth contact face CP6. The source region 28 is provided between eighth contact face CP8 and body contact region 27.

As illustrated in FIG. 10, the body contact region 27 in contact with the first contact portion 12$x$ and the body contact region 27 in contact with the second contact portion 12$y$ are continuous in the third direction.

With the MOSFET 200 of the second embodiment, since the source electrode 12 includes the first contact portion 12$x$, the second contact portion 12$y$, and the third contact portion 12$z$, a contact area between the source electrode 12 and the source region 28 can be further increased as compared with the MOSFET 100 of the first embodiment. Therefore, the parasitic resistance of the MOSFET 200 can be reduced.

As described above, according to the second embodiment, it is possible to provide a semiconductor device capable of reducing on-resistance by reducing parasitic resistance.

In the first and second embodiments, the case of 4H—SiC has been described as an example of the crystal structure of SiC, but the present disclosure can also be applied to devices using SiC having other crystal structures such as 6H—SiC and 3C—SiC. Further, it is also possible to apply a face other than the (0001) face to the surface of the silicon carbide layer 10.

In the first and second embodiments, the case where the first conductivity type is the n-type and the second conductivity type is the p-type has been described as an example, but the first conductivity type may be the p-type and the second conductivity type may be the n-type.

In the first and second embodiments, aluminum (Al) is exemplified as the p-type impurity, but boron (B) can also be used. In addition, although nitrogen (N) and phosphorus (P) have been exemplified as the n-type impurity, arsenic (As), antimony (Sb), and the like can also be applied.

In addition, in the first and second embodiments, the MOSFET in which the gate electrode extends in one direction has been described as an example, but for example, a MOSFET in which the gate electrode has a lattice shape may be used.

In the first and second embodiments, the case where the semiconductor device is the MOSFET has been described as an example, but the semiconductor device may be an insulated gate bipolar transistor (IGBT).

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:

a silicon carbide layer having a first face and a second face facing the first face;

a first gate electrode provided on a side of the first face of the silicon carbide layer;

a second gate electrode provided on the side of the first face of the silicon carbide layer;

a first silicon carbide region of a first conductivity type provided in the silicon carbide layer, the first silicon carbide region having a first region in contact with the first face, the first region facing the first gate electrode;

a second silicon carbide region of a second conductivity type provided in the silicon carbide layer and provided between the first silicon carbide region and the first face, the second silicon carbide region having a second region in contact with the first face, the second region facing the first gate electrode;

a third silicon carbide region of the second conductivity type provided in the silicon carbide layer and provided between the second silicon carbide region and the first face, the third silicon carbide region having a second conductivity type impurity concentration higher than a second conductivity type impurity concentration of the second silicon carbide region;

a fourth silicon carbide region of the first conductivity type provided in the silicon carbide layer and provided between the third silicon carbide region and the first face;

a first gate insulating layer provided between the first gate electrode and the second region;

a first electrode provided on the side of the first face of the silicon carbide layer; and a second electrode provided on a side of the second face of the silicon carbide layer, wherein the first electrode includes a first portion provided between the first gate electrode and the second gate electrode, and the first portion has a first contact face, a second contact face, a third contact face, and a fourth contact face each in contact with the silicon carbide layer, the first contact face intersects the first face, the second contact face intersects the first contact face, the third contact face intersects the second contact face, and the fourth contact face intersects the third contact face, and further wherein:

the first contact face is contiguous with the second contact face, is entirely in contact with the fourth silicon carbide region, and faces the second region;

the second contact face is contiguous with the third contact face, is in contact with the fourth silicon carbide region, and faces the second face;

the third contact face is contiguous with the fourth contact face, is in contact with the fourth silicon carbide region and the third silicon carbide region; and the fourth contact face is in contact with the third silicon carbide region and faces the second face.

2. The semiconductor device according to claim 1, wherein a distance from the first face to the second contact face in a first direction from the first face to the second face is equal to or more than ⅓ of a depth of the fourth silicon carbide region in the first direction.

3. The semiconductor device according to claim 1, wherein a distance from the first face to the second contact face in a first direction from the first face to the second face is equal to or more than 50 nm.

4. The semiconductor device according to claim 1, wherein a length of a portion at which the third contact face and the fourth silicon carbide region are in contact with each other in a first direction from the first face to the second face is longer than a length of a portion at which the third contact face and the third silicon carbide region are in contact with each other in the first direction.

5. The semiconductor device according to claim 1, wherein the first portion includes a silicide region having the first contact face, the second contact face, the third contact face, and the fourth contact face.

6. The semiconductor device according to claim 5, wherein the silicide region contains nickel silicide.

7. The semiconductor device according to claim 1, wherein a distance from the first face to the fourth contact face in a first direction from the first face to the second face is equal to or more than 150 nm.

8. The semiconductor device according to claim 1, wherein:

the first gate electrode and the second gate electrode extend in a third direction parallel to the first face;

the first electrode further includes a second portion provided between the first gate electrode and the second gate electrode and located in the third direction of the first portion;

the fourth silicon carbide region is provided between the first portion and the second portion;

the first portion further has a fifth contact face in contact with the silicon carbide layer, the fifth contact face intersecting the fourth contact face;

the second portion has a sixth contact face in contact with the silicon carbide layer and a seventh contact face in contact with the silicon carbide layer, the seventh contact face intersecting the sixth contact face;

the fifth contact face is in contact with the fourth silicon carbide region and the third silicon carbide region;

the sixth contact face is in contact with the fourth silicon carbide region and the third silicon carbide region and faces the fifth contact face; and the seventh contact face is in contact with the third silicon carbide region and faces the second face.

9. The semiconductor device according to claim 8, wherein the third silicon carbide region in contact with the first portion and the third silicon carbide region in contact with the second portion are continuous in the third direction.

10. The semiconductor device according to claim 8, wherein:

the first electrode further includes a third portion provided between the first gate electrode and the second gate electrode and located between the first portion and the second portion;

the third portion has an eighth contact face in contact with the silicon carbide layer; and the eighth contact face is in contact with the fourth silicon carbide region and faces the second face.

11. A semiconductor device comprising:

a silicon carbide layer having a first face and a second face facing the first face;

a first gate electrode provided on a side of the first face of the silicon carbide layer;

a second gate electrode provided on the side of the first face of the silicon carbide layer;

a first silicon carbide region of a first conductivity type provided in the silicon carbide layer, the first silicon carbide region having a first region in contact with the first face, the first region facing the first gate electrode;

a second silicon carbide region of a second conductivity type provided in the silicon carbide layer and provided between the first silicon carbide region and the first face, the second silicon carbide region having a second region in contact with the first face, the second region facing the first gate electrode;

a third silicon carbide region of the second conductivity type provided in the silicon carbide layer and provided between the second silicon carbide region and the first face, the third silicon carbide region having a second conductivity type impurity concentration higher than a second conductivity type impurity concentration of the second silicon carbide region;

a fourth silicon carbide region of the first conductivity type provided in the silicon carbide layer and provided between the third silicon carbide region and the first face;

a first gate insulating layer provided between the first gate electrode and the second region;

a first electrode provided on the side of the first face of the silicon carbide layer; and a second electrode provided on a side of the second face of the silicon carbide layer, wherein the first electrode includes a first portion provided between the first gate electrode and the second gate electrode, and the first portion has a first contact face, a second contact face, a third contact face, and a fourth contact face each in contact with the silicon carbide layer, the first contact face intersects the first face, the second contact face intersects the first contact face, the third contact face intersects the second contact face, and the fourth contact face intersects the third contact face, and further wherein:

the first contact face is entirely in contact with the fourth silicon carbide region and faces the second region;

the second contact face is entirely in contact with the fourth silicon carbide region and faces the second face;

the third contact face is in contact with the fourth silicon carbide region and the third silicon carbide region; and the fourth contact face is in contact with the third silicon carbide region and faces the second face.

12. The semiconductor device according to claim 11, wherein a distance from the first face to the second contact face in a first direction from the first face to the second face is equal to or more than $\frac{1}{3}$ of a depth of the fourth silicon carbide region in the first direction.

13. The semiconductor device according to claim 11, wherein a distance from the first face to the second contact face in a first direction from the first face to the second face is equal to or more than 50 nm.

* * * * *